(12) United States Patent
Zennamo, Jr. et al.

(10) Patent No.: US 6,429,754 B1
(45) Date of Patent: Aug. 6, 2002

(54) ELECTRICAL SIGNAL FILTER WITH IMPROVED ISOLATION SHIELD

(75) Inventors: Joseph A. Zennamo, Jr., Skaneateles; Joseph N. Maguire, Syracuse, both of NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

(21) Appl. No.: 09/456,596

(22) Filed: Dec. 8, 1999

(51) Int. Cl.$^7$ .................................................. H03H 7/00
(52) U.S. Cl. ........................ 333/167; 333/185; 333/175
(58) Field of Search ................................ 333/175, 185, 333/167; 439/620

(56) References Cited

U.S. PATENT DOCUMENTS

| | | | |
|---|---|---|---|
| 4,451,803 A | | 5/1984 | Holdsworth et al. .......... 333/12 |
| 4,845,447 A | * | 7/1989 | Holdsworth ................ 333/167 |
| 5,278,525 A | * | 1/1994 | Palinkas ..................... 333/175 |
| 5,440,282 A | * | 8/1995 | Devendorf et al. .......... 333/185 |
| 6,165,019 A | * | 12/2000 | Kha et al. .................... 439/620 |
| 6,255,920 B1 | * | 7/2001 | Ohwada et al. ............. 333/206 |

\* cited by examiner

*Primary Examiner*—Robert Pascal
*Assistant Examiner*—Dean Takaoka
(74) *Attorney, Agent, or Firm*—Burr & Brown

(57) ABSTRACT

An electrical signal filter including elongate upper and lower filter housing members abutted along a longitudinal seam between the housing members. The housing members hold at least one circuit board having first and second filter sections electrically connected to one another. An isolation shield is formed integrally with at least the lower filter housing member and extends inwardly and upwardly from the inner surface of the lower filter housing member in a direction substantially perpendicular to the longitudinal extension of the housing member. The circuit board has at least one slot for receiving at least a portion of the isolation shield, and is positioned within the filter housing members such that the isolation shield provides magnetic isolation between the first and second filter sections.

40 Claims, 4 Drawing Sheets

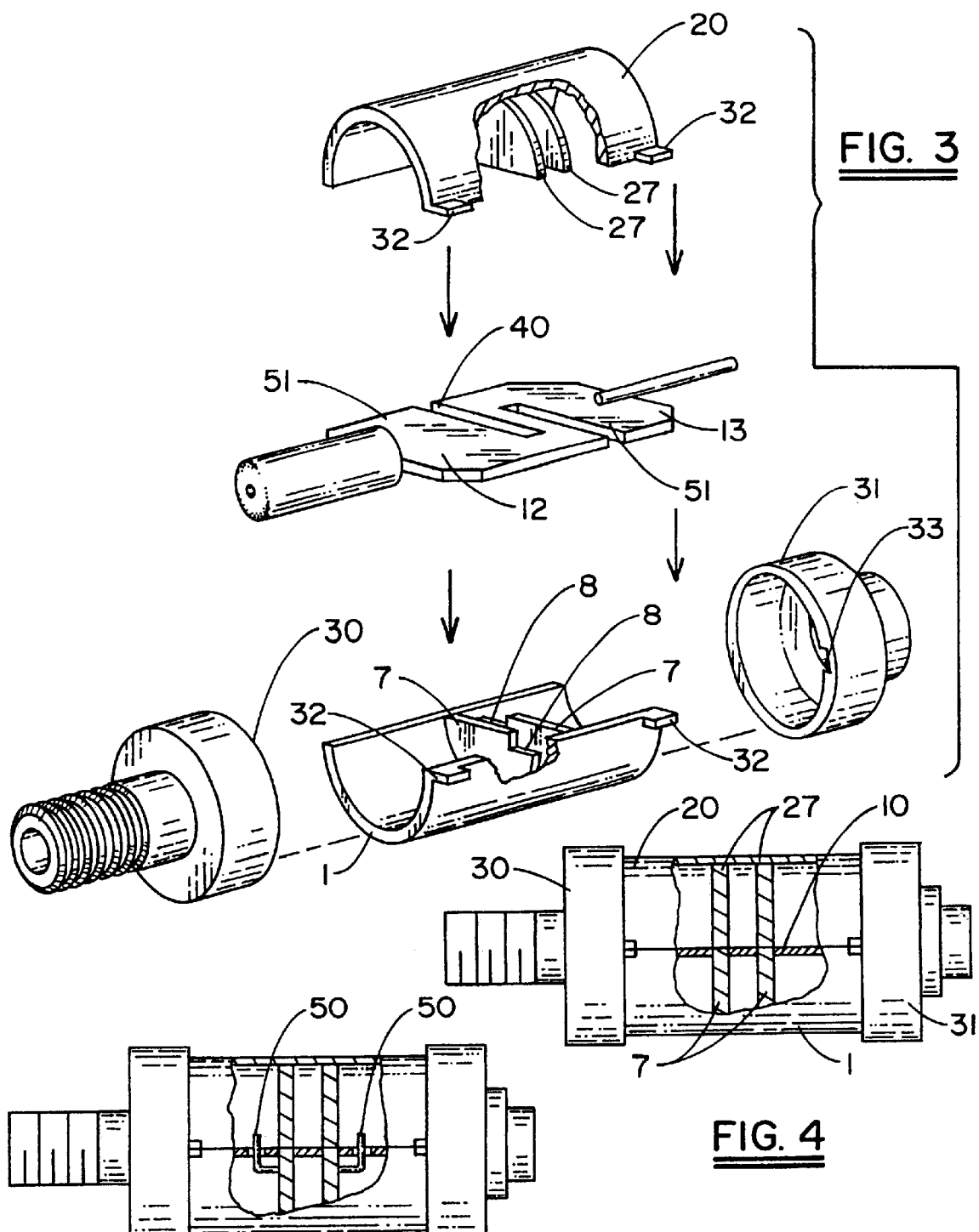

ELECTRICAL SIGNAL FILTER WITH IMPROVED ISOLATION SHIELD

FIELD OF THE INVENTION

The present invention relates to an electrical signal filter with an improved isolation shield for magnetically isolating electrically interconnected filter sections from one another.

BACKGROUND OF THE INVENTION

Various types of electrical signal filters are used in the CATV industry for controlling, on a frequency basis, the propagation of signals through a cable line. One example of such a filter is disclosed in U.S. Pat. No. 4,451,803, the entirety of which is incorporated herein by reference. The '803 patent discloses a split tuning filter of the type that is commonly referred to as a notch filter, for removing a selected frequency or band of frequencies from a CATV signal. With reference to FIG. 7, the split tuning filter includes a common circuit board 100 having first 102 and second 103 filter sections formed thereon by discrete electronic components such as inductors, capacitors and the like (not shown). Isolation shields 104, 105 are arranged at a midpoint along circuit board 100 to provide magnetic isolation between first filter section 102 and second filter section 103. Each shield includes a radially extending disc section 106 and a longitudinally extending flange section 107. A slot 108 is formed in each shield, to allow the remaining, unslotted portion of disc 106 to slide into a corresponding slot 101 formed in circuit board 100. One of the shields is pressed into a slot formed on one side of the circuit board, and the other shield is pressed into a slot formed on an opposed side of the circuit board, as shown in FIG. 7. As explained in the '803 patent, this arrangement prevents any "line of sight" communication between components in the first and second filter sections.

Once the shields 104, 105 are positioned on opposite sides of circuit board 100, the circuit board is inserted into housing 109, the open end of which is closed by filter cap 110. This subassembly is then inserted into a tube sleeve housing (not shown) to form the final filter structure.

While the filter disclosed in the '803 patent is highly successful in providing magnetic isolation between the first 102 and second 103 filter sections, there are several drawbacks associated with the use of shields 104 and 105. First, the shields must be soldered not only to circuit board 100, but also to filter housing 109, in order to ground the circuit board. While the shields can be soldered to circuit board 100 with relative ease, it is relatively difficult to solder the shields to filter housing 109 once the shields are positioned within the confines of the housing. In order to achieve this type of soldering operation, it is necessary to apply a high heat source to the exterior of filter housing 109, which can adversely effect the characteristics of the electrical components already positioned on circuit board 100. It is also difficult to control the flow of solder within the confines of filter housing 109, and thus it is not uncommon for one or both sides of the filter to become shorted. Such shorted filters must, of course, be discarded.

Another problem relates to flange 107. The flange is present on each shield in order to guide circuit board 100 into filter housing 109 and to provide a soldering surface parallel to the wall of filter housing 109. The electronic components on the circuit board, however, must be spaced away from the shields by a distance greater than the longitudinal length of flange 107 to allow the shields to be inserted into slots 101 on opposite sides of circuit board 100. The longitudinal length of flange 107, therefore, unnecessarily increases the overall length of the filter. This problem is even more noticeable in six-pole and eight-pole filters, which use multiple shields.

Yet another problem is that the shields, being separate components, increase the total number of components that must be handled during assembly of the overall filter device. This in turn increases manufacturing time and expense.

It would be desirable to provide an electrical signal filter having isolation shields that are easy to handle and solder within the filter housing. No such filter currently exists.

SUMMARY OF THE INVENTION

It is an object of the present invention to provide an electrical signal filter that can overcome all the drawbacks associated with the prior art filters discussed above. In accordance with one object of the present invention, an electrical signal filter is provided that includes an elongate lower filter housing member extending along a first longitudinal direction from a first end thereof to an opposed second end thereof, and having an inner surface terminating at first and second upper side surfaces that extend from the first end to the second end. The filter also includes an elongate upper filter housing member extending along the first longitudinal direction from a first end thereof to an opposed second end thereof, and having an inner surface terminating at first and second lower side surfaces that extend from the first end to the second end. The elongate upper filter housing member abuts the elongate lower filter housing member at the first and second lower and upper side surfaces, respectively, along a longitudinal junction. An isolation shield is formed integrally with at least the elongate lower filter housing member and extends inwardly and upwardly from the inner surface thereof in a direction substantially perpendicular to the first longitudinal direction to thereby define first and second internal filter cavities separated by the isolation shield. A first filter section is arranged in the first internal filter cavity and a second filter section, electrically connected to the first filter section, is arranged in the second internal filter cavity. The isolation shield provides magnetic isolation between the first and second filter sections.

In accordance with a preferred embodiment, the isolation shield extends inwardly and upwardly from the inner surface of the elongate lower filter housing member to a position proximate a plane intersecting the first and second upper side surfaces thereof, and a second isolation shield is formed integrally with the elongate upper filter housing member and extends inwardly and downwardly from the inner surface thereof in axial alignment with the isolation shield of the elongate lower filter housing member.

More preferably, the upper surface of the isolation shield of the elongate lower filter housing member has a shape that is complementary to a shape of the lower surface of the second isolation shield of the elongate upper filter housing member, and those surfaces mate with each other to form the appearance of an integral shield.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which:

FIG. 3 is an exploded perspective view showing a filter in accordance with another embodiment of the present invention;

FIG. 4 is a partial sectional view of the filter of FIG. 3;

FIG. 5 is a partial sectional view of an alternative embodiment of the filter shown in FIG. 4;

DETAILED DESCRIPTION OF THE INVENTION

Figures 1, 2:
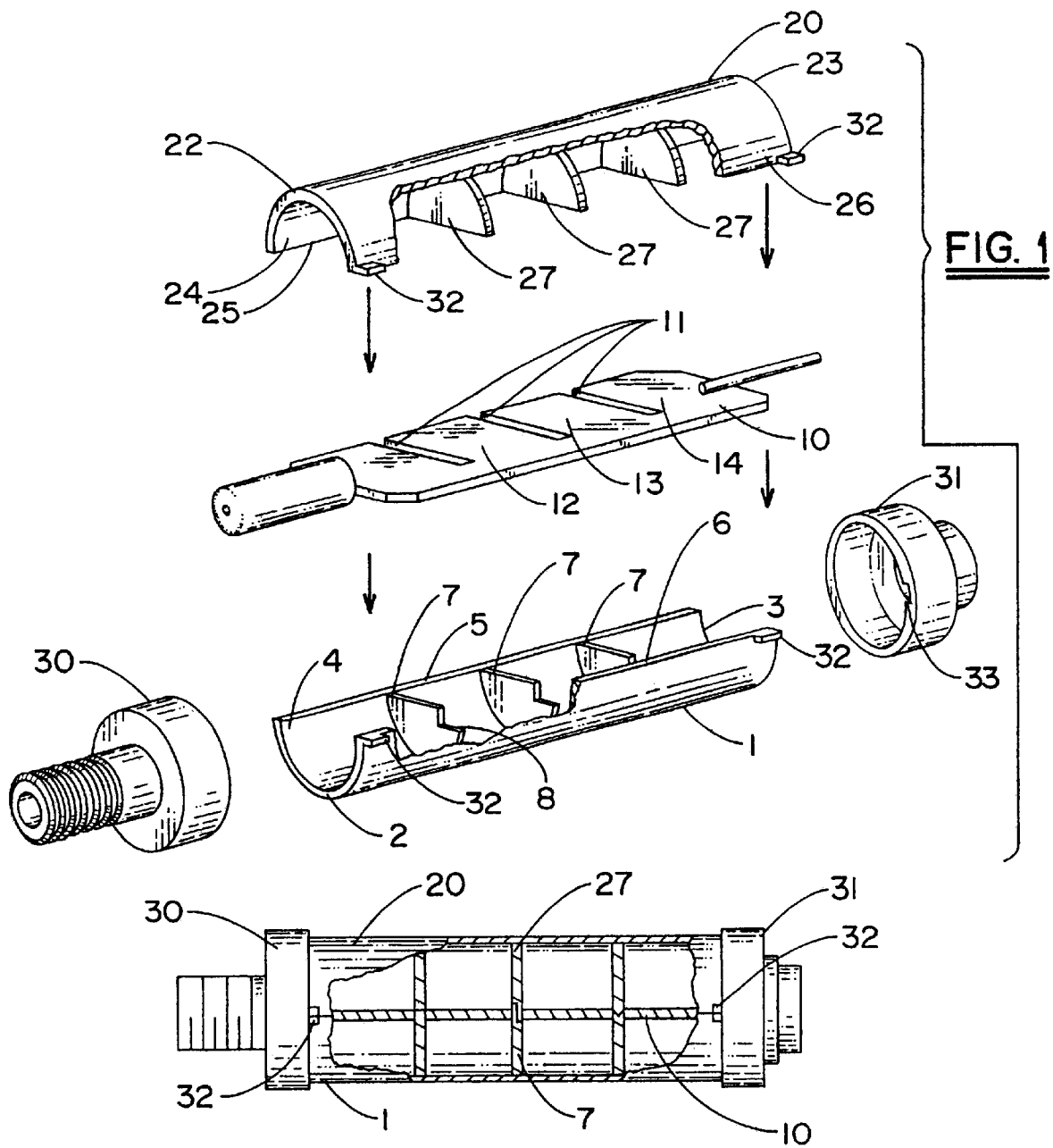
FIG. 1 is an exploded perspective view showing a filter in accordance with one embodiment of the present invention.
FIG. 2 is a partial sectional view of the filter of FIG. 1, showing various abutting surfaces for the upper and lower shield members.

FIG. 1 is an exploded perspective view of an electrical signal filter in accordance with one embodiment of the present invention. The filter includes a lower filter housing member 1 that generally takes the shape of one-half of a hollow cylinder; it could, however, take any shape that would allow the objectives of the invention to be realized. The lower filter housing member has a first end 2 and an opposed second end 3, and an inner surface 4 that extends from the first end 2 to the second end 3. Inner surface 4 terminates at first 5 and second 6 longitudinal side surfaces that also extend from first end 2 to second end 3 of lower housing member 1. Lower shield members 7 are formed integrally with lower housing member 1 and extend radially inwardly from inner surface 4 in a direction substantially perpendicular to the longitudinal axis of housing member 1. Each lower shield member 7 includes a recessed portion 8 that allows circuit board 10 to rest below the upper surface of shield member 7. Circuit board 10 includes slots 11 that allow the non-recessed portions of each lower shield member 7 to pass through circuit board 10.

Circuit board 10 includes a first filter section 12, a second filter section 13, and a third filter section 14, all electrically interconnected by conductor lines (not shown) formed on circuit board 10 around slots 11. The electronic components in each filter section have been omitted in the drawings. Exemplary components that could be used are disclosed in detail in U.S. Pat. No. 5,770,983, the entirety of which is incorporated herein by reference. Such a three-section filter could be used as a six-pole tier trap, for example. In such a filter, the filter sections 12, 13 and 14 need to be magnetically isolated from one another. The lower shield members 7 provide the necessary magnetic isolation between filter sections 12, 13 and 14 both within the body of circuit board 10 and in the lower section of housing member 1 beneath circuit board 10.

Upper filter housing member 20 has basically the same construction as lower filter housing member 1, in that it includes opposed first 22 and second 23 ends, and an inner surface 24 that terminates along longitudinal side surfaces 25 and 26. The upper shield members 27, however, take the shape of substantially semicircular discs with no recessed portions. The upper shield members 27 are aligned axially, along the longitudinal axis of the filter, with lower shield members 7 so that, when the upper and lower housing members about one another to form a cylindrical filter housing, the upper and lower shield members align to form metal disc shields that isolate the various filter sections on circuit board 10 from one another.

Once circuit board 10 is positioned within lower filter housing member 1, upper filter housing member 20 is abutted thereto along the respective longitudinal side surfaces of each housing member. It is preferred that the abutted longitudinal side surfaces 5, 6 and 25, 26, respectively, have complementary shapes, such as rabbet or chevron joints, to allow the housing members to abut in a mating fashion. Such mated abutment reduces RFI/EMI leakage outside the housing, and also inhibits the flow of potting foam outside the housing. It is possible, however, to form the longitudinal side surfaces as butt joints, and then solder the housing members along the junction of the respective longitudinal side surfaces.

FIG. 1 shows that the filter also includes connector end caps 30, 31 that close the first and second ends of the filter housings and provide connection points for external components. It is preferred that the end caps are press-fit over the ends of the abutted filter housing members. In this regard, the opposite ends of the filter housing could be of reduced diameter, such that the end caps, once in place, have an outside diameter the same as or only slightly larger than the outside diameter of the main central portion of the filter housing. If necessary, to provide additional sealing and/or mechanical integrity, the end caps can be soldered in place.

FIG. 1 also shows that the upper and lower filter housing members include boss members 32, that align when the housing members are abutted, to be received within complementary grooves 33 in end caps 30, 31. This arrangement prevents rotation of the end caps relative to the housing. This is important since the filter device is often rotated as a whole when installed and the device could be damaged if the end caps were allowed to rotate independent of the filter housing.

In accordance with a preferred embodiment of the present invention, the upper surface of lower shield members 7 and the lower surface of upper shield members 27 have complementary shapes, such as shown in FIG. 2, to allow the lower and upper shield members to mate with one another and form a more effective isolation shield. The left-hand shield in FIG. 2 shows the lower 7 and upper 27 shield members taking the shape of a simple butt joint, while the middle and right-hand shields show rabbet and chevron joints, respectively.

While any method could be used to form the filter housing members, it is preferred that the lower and upper housing members are cast or pressed to include the respective shield members as integral parts. This solves one of the problems associated with the prior art, in that the isolation shields and filter housing members can be handled as single units.

The filter shown in FIG. 1 also avoids the need to solder the isolation shields to the inner surface of the filter housing, as those shields are formed as integral extensions of the filter housing members. Moreover, since the filter housing members are split longitudinally, and the circuit board 10 is placed along the Z-axis direction into lower filter housing member 1, it is easier to solder circuit board 10 to each lower shield member 7 to establish a good ground contact (i.e., the solder joints are exposed). Moreover, the fact that the circuit board and upper housing member are assembled in the Z-axis direction facilitates mass production.

The materials used for the upper and lower filter housing members and the upper and lower shield members can be any of the materials conventionally used, such as die cast zinc alloy #3 or #5. If it is necessary to use a less electrically conductive material to form the integral housing and shield members, it is possible to coat the inner surfaces of the housing and shield members with an electrically conductive coating to provide sufficient electrical performance with respect to the necessary ground connections.

The integral construction of the housing and shield members also allows for a reduction in length of the overall filter device. It can be seen from the drawings that the shield members 7 and 27 do not have longitudinally extending flange members, as in the prior art. As a result, it is no longer necessary to space electrical components away from the shield members to allow room for the shield members to be inserted into the circuit board, as in the prior art. It is expected that at least 1/10 of an inch will be saved for every shield employed. This size reduction is significant in an industry such as the CATV industry, where component space is limited. The size reduction also reduces material cost.

FIGS. 3 and 4 show a filter having only two filter sections 12, 13 that need to be magnetically isolated from one another, such as a four-pole split tuning filter (see, for example, U.S. Pat. Nos 4,451,803 and 5,770,983). It is known in the art that in this type of filter the four poles are tuned to the same frequency. As explained in the '803 patent, it is imperative to provide adequate magnetic isolation between the first and second filter sections to avoid detuning one filter section when tuning the other filter section. As such, it is preferable to use two lower shield members 7 having recesses 8 arranged on opposite sides of the filter housing. As shown in FIG. 3, circuit board 10 has a serpentine conductor section 40 that provides electrical communication between the first 12 and second filter 13 sections. The upper shield members 27, as shown in FIG. 3, are configured the same as upper shield members 27 in FIG. 1. When the upper 1 and lower 20 filter housing members are assembled together (in the manner explained above), FIG. 4 shows that the lower 7 and upper 27 shield members abut to form mated disc shields (other abutting surfaces, as shown in FIG. 2, could also be used). As the recesses 8 in the shields are offset, the disc shields prevent any "line of sight" communication between the components of the first 12 and second filter 13 sections. This configuration provides sufficient magnetic isolation between the two filter sections in a four-pole notch filter type application.

In accordance with the present invention, when circuit board 10 is positioned in lower filter housing member 1, it is relatively easy to solder the ground termination between lower shield members 7 and the ground conductors on the circuit board. There is a possibility, however, that a space may exist between slots 11 in circuit board 10 and lower shield members 7. Solder may flow through this space below circuit board 10 in an uncontrolled manner. In an attempt to alleviate this potential problem, FIG. 5 shows an alternative embodiment of the filter device shown in FIG. 4, wherein ground posts 50 extend outwardly and upwardly from lower shield member 7 through a corresponding hole 51 in each filter section of circuit board 10. The ground posts could be soldered to the shields or formed integrally therewith when forming the shields. In the latter case, the ground posts should extend along the same axis as that of the casting operation used to form the shields (e.g., along the Z-axis direction).

When the ground posts extend upward through the circuit board, the upper portions thereof can be solder-terminated to the circuit board. Alternatively, the ground posts can be formed with a pedestal portion arranged below the circuit board and the upper portions thereof can be peened over to form a gas-free compression joint between a ground termination formed on the lower surface of the circuit board and an upper surface of the pedestal-shaped portion of the ground posts. Another option would be to terminate each ground post at the level of the pedestal portion and then insert a fastener (e.g., a screw) through the circuit board to form a gas-free compression joint between the ground termination formed on the lower surface of the circuit board and the pedestal portion of the ground post.

All of the above-described options are effective to prevent the problem of uncontrolled solder flow below the circuit board. That is, even if the ground posts are soldered to the circuit board, the soldering operation is performed at a position on circuit board 10 away from any space that might exist between slots 11 and lower shield members 7.

Figure 6:
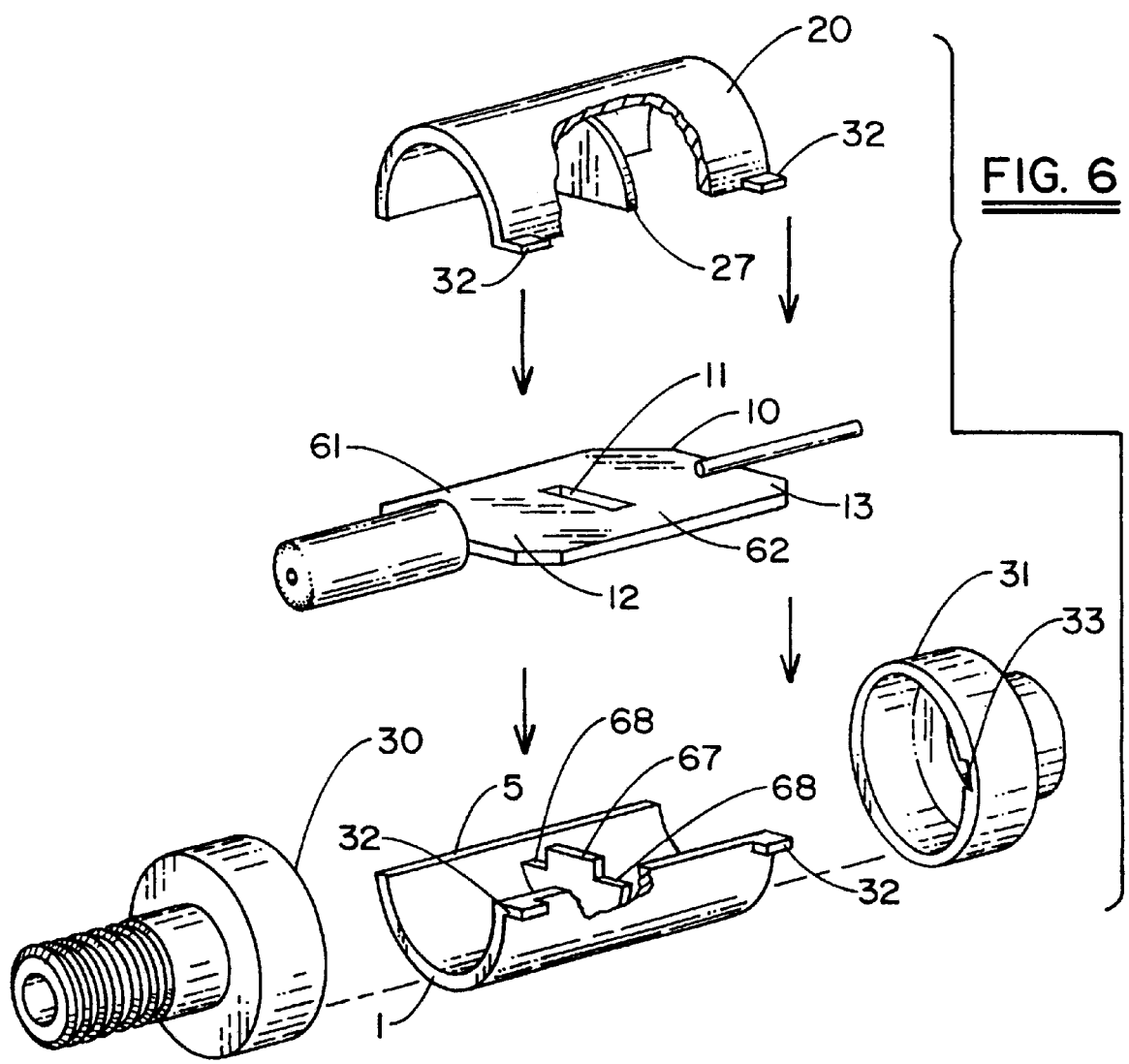
FIG. 6 is an exploded perspective view showing a filter in accordance with yet another embodiment of the present invention.
Figure 7:
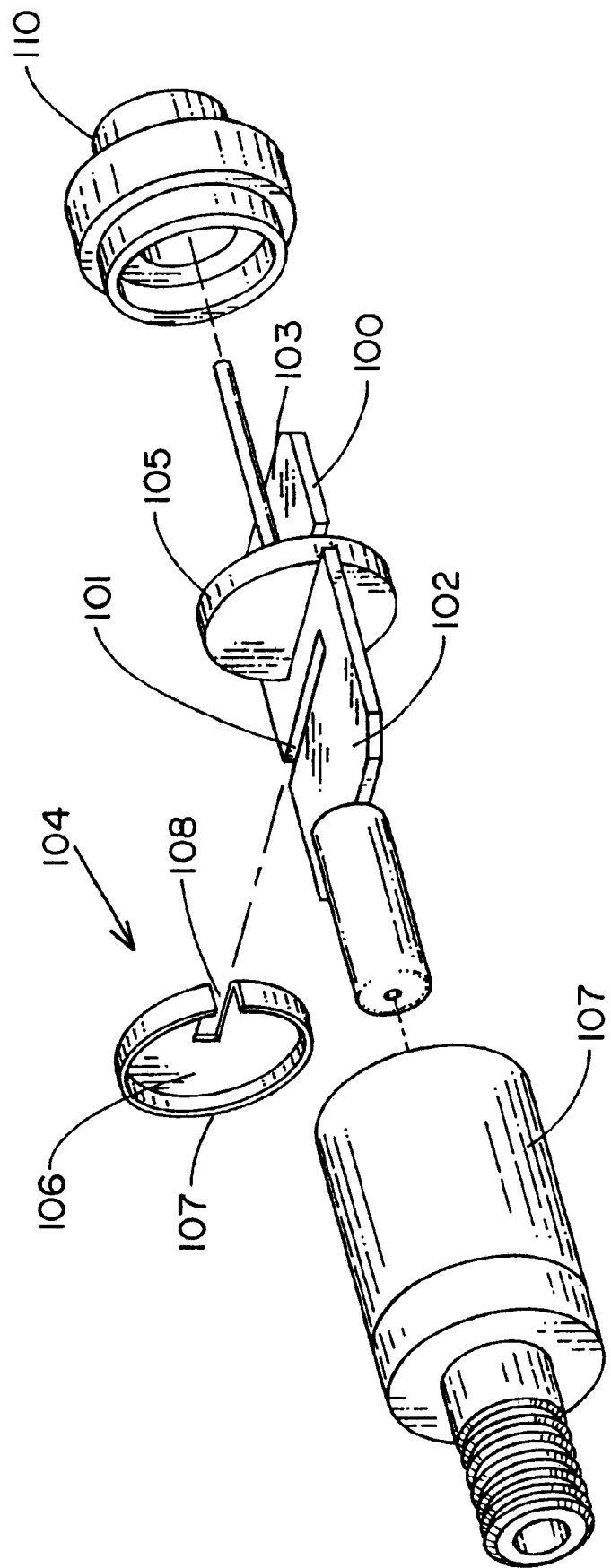
FIG. 7 is an exploded perspective view showing a filter in accordance with the prior art.

FIG. 6 shows yet another embodiment of a filter in accordance with the present invention. The filter includes the same components as in FIG. 3, except the two, recess-opposed lower shield members 7 are replaced with a single lower shield member 67 having recesses 68 on opposite sides thereof adjacent each longitudinal side surface 5, 6. The recesses 68 can be made sufficiently small to minimize any "line of sight" between components on the first 12 and second 13 filter sections.

FIG. 6 shows that slot 11 is formed in the interior of circuit board 10, thus leaving contiguous side portions 61, 62 on circuit board 10. A circuit board of this construction is more mechanically sound compared to the circuit board shown in FIG. 3. The conductor line connecting first 12 and second 13 filter sections can be formed on either side portion 61, 62.

Although not shown in the drawings, the slot 11 in circuit board 10 shown in FIG. 6 could be replaced with two slots on opposite sides of the circuit board, and a single recess 68 could be formed in a central region of lower shield member 67.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. An electrical signal filter, comprising:

an elongate lower filter housing member extending along a first longitudinal direction from a first end thereof to an opposed second end thereof, and having an inner surface terminating at first and second upper side surfaces that extend from said first end to said second end, said elongate lower filter housing member further comprising an isolation shield formed integrally therewith and extending inwardly and upwardly from said inner surface in a direction substantially perpendicular to said first longitudinal direction;

an elongate upper filter housing member extending along said first longitudinal direction from a first end thereof to an opposed second end thereof, and having an inner surface terminating at first and second lower side surfaces that extend from said first end to said second end, said elongate upper filter housing member abutting said elongate lower filter housing member at a junction between said first and second lower side surfaces and said first and second upper side surfaces, respectively, to thereby define first and second internal filter cavities separated by said isolation shield; and a first filter section electrically connected to a second filter section, said first filter section being arranged in said first internal filter cavity and said second filter section being arranged in said second internal filter cavity, such that said isolation shield provides magnetic isolation between said first and second filter sections.

2. The electrical signal filter of claim 1, wherein said isolation shield extends inwardly and upwardly from said inner surface of said elongate lower filter housing member to a position proximate a plane intersecting said first and second upper side surfaces.

3. The electrical signal filter of claim 2, further comprising a second isolation shield formed integrally with said elongate upper filter housing member and extending inwardly and downwardly from said inner surface of said elongate upper filter housing member in a direction substantially perpendicular to said first longitudinal direction.

4. The electrical signal filter of claim 3, wherein said second isolation shield is aligned, along said first longitudinal direction, with said isolation shield of said elongate lower filter housing member.

5. The electrical signal filter of claim 3, wherein an upper surface of said isolation shield of said elongate lower filter housing member extends above a plane in which said first and second filter sections lie, and abuts a lower surface of said second isolation shield.

6. The electrical signal filter of claim 5, wherein said upper surface of said isolation shield of said elongate lower filter housing member has a shape that is complementary to a shape of said lower surface of said second isolation shield.

7. The electrical signal filter of claim 1, wherein said first and second lower side surfaces of said elongate upper filter housing member have shapes that are complementary to shapes of said first and second upper side surfaces of said elongate lower filter housing member.

8. The electrical signal filter of claim 1, further comprising first and second connector end caps attached to said first and second ends of the filter housing members to close said first and second internal filter cavities, respectively.

9. The electrical signal filter of claim 8, further comprising solder joints to attach said first and second connector end caps to the filter housing members.

10. The electrical signal filter of claim 8, further comprising means for preventing rotation of said first and second connector end caps relative to the filter housing members.

11. The electrical signal filter of claim 1, further comprising at least one ground post extending upwardly from said isolation shield to make electrical contact with at least one portion of at least one of said first and second filter sections.

12. The electrical signal filter of claim 11, wherein said at least one ground post extends away from said isolation shield to make electrical contact with said at least one portion that is spaced axially from said isolation shield by a predetermined distance.

13. An electrical signal filter, comprising:
an elongate lower filter housing member extending along a first longitudinal direction from a first end thereof to an opposed second end thereof, and having an inner surface terminating at first and second upper side surfaces that extend from said first end to said second end, said elongate lower filter housing member further comprising an isolation shield formed integrally therewith and extending inwardly and upwardly from said inner surface in a direction substantially perpendicular to said first longitudinal direction;
an elongate upper filter housing member extending along said first longitudinal direction from a first end thereof to an opposed second end thereof, and having an inner surface terminating at first and second lower side surfaces that extend from said first end to said second end, said elongate upper filter housing member abutting said elongate lower filter housing member at a junction between said first and second lower side surfaces and said first and second upper side surfaces, respectively, to thereby define an internal filter cavity; and
a one-piece circuit board having a first filter section electrically connected to a second filter section, said circuit board having at least one slot for receiving at least a portion of said isolation shield, and being positioned in said internal filter cavity such that said isolation shield provides magnetic isolation between said first and second filter sections.

14. The electrical signal filter of claim 13, wherein said isolation shield extends inwardly and upwardly from said inner surface of said elongate lower filter housing member to a position proximate a plane intersecting said first and second upper side surfaces.

15. The electrical signal filter of claim 14, further comprising a second isolation shield formed integrally with said elongate upper filter housing member and extending inwardly and downwardly from said inner surface of said elongate upper filter housing member in a direction substantially perpendicular to said first longitudinal direction.

16. The electrical signal filter of claim 15, wherein said second isolation shield is aligned, along said first longitudinal direction, with said isolation shield of said elongate lower filter housing member.

17. The electrical signal filter of claim 15, wherein an upper surface of said isolation shield of said elongate lower filter housing member extends above a plane in which said circuit board lies, and abuts a lower surface of said second isolation shield.

18. The electrical signal filter of claim 17, wherein said upper surface of said isolation shield of said elongate lower filter housing member has a shape that is complementary to a shape of said lower surface of said second isolation shield.

19. The electrical signal filter of claim 13, wherein said first and second lower side surfaces of said elongate upper filter housing member have shapes that are complementary to shapes of said first and second upper side surfaces of said elongate lower filter housing member.

20. The electrical signal filter of claim 13, further comprising first and second connector end caps attached to said first and second ends of the filter housing members to close said internal filter cavity.

21. The electrical signal filter of claim 20, further comprising solder joints to attach said first and second connector end caps to the filter housing members.

22. The electrical signal filter of claim 20, further comprising means for preventing rotation of said first and second connector end caps relative to the filter housing members.

23. The electrical signal filter of claim 13, further comprising at least one ground post extending upwardly from said isolation shield to make electrical contact with at least one portion of said circuit board.

24. The electrical signal filter of claim 23, wherein said at least one ground post extends away from said isolation shield to make electrical contact with said at least one portion that is spaced axially from said isolation shield by a predetermined distance.

25. The electrical signal filter of claim 13, wherein said slot for receiving at least a portion of said isolation shield is formed in at least one side of said circuit board.

26. The electrical signal filter of claim 13, wherein said slot for receiving at least a portion of said isolation shield is formed in an interior region of said circuit board spaced from side surfaces thereof.

27. An electrical signal filter, comprising:
an elongate cylindrical filter housing comprising upper and lower filter housing members each having substantially the shape of one-half a hollow cylinder, and each including an isolation shield formed integrally therewith and extending inwardly from an inner surface thereof in a direction substantially perpendicular to a longitudinal extension of the filter housing, longitudinal side surfaces of the upper and lower filter housing members abutting one another along a longitudinal junction such that the isolation shield from the lower filter housing member cooperates with the isolation shield of the upper filter housing member to divide the interior of the filter housing into first and second cavities;

a one-piece circuit board having first and second filter sections arranged within said first and second cavities, respectively, said first and second filter sections being electrically connected, and being magnetically isolated from one another by the presence of said isolation shields therebetween; and connector end caps joined to opposite ends of said filter housing.

28. The electrical signal filter of claim 27, wherein the isolation shield formed integrally with the lower filter housing member extends inwardly and upwardly to a position proximate a plane intersecting said longitudinal junction.

29. The electrical signal filter of claim 27, wherein the isolation shields of the upper and lower filter housing members are aligned along the longitudinal extension of the filter housing.

30. The electrical signal filter of claim 29, wherein an upper surface of the isolation shield of the lower filter housing member extends above a plane in which said circuit board lies, and abuts a lower surface of the isolation shield of the upper filter housing member.

31. The electrical signal filter of claim 29, wherein an upper surface of the isolation shield of the lower filter housing member has a shape that is complementary to a shape of a lower surface of the isolation shield of the upper filter housing member.

32. The electrical signal filter of claim 27, wherein said longitudinal side surfaces of the upper and lower filter housing members have shapes that are complementary to one another.

33. The electrical signal filter of claim 27, further comprising solder joints to attach said connector end caps to said filter housing.

34. The electrical signal filter of claim 27, further comprising means for preventing rotation of said connector end caps relative to said filter housing.

35. The electrical signal filter of claim 27, further comprising at least one ground post extending upwardly from the isolation shield formed integrally with said lower filter housing member to make electrical contact with at least one portion of said circuit board.

36. The electrical signal filter of claim 35, wherein said at least one ground post extends away from the isolation shield formed integrally with said lower filter housing member to make electrical contact with said at least one portion that is spaced axially from said isolation shield by a predetermined distance.

37. The electrical signal filter of claim 27, wherein said circuit board includes a slot for receiving at least a portion of the isolation shield formed integrally with said lower filter housing member.

38. The electrical signal filter of claim 37, wherein said slot is formed in at least one side of said circuit board.

39. The electrical signal filter of claim 37, wherein said slot is formed in an interior region of said circuit board spaced from side surfaces thereof.

40. An electrical signal filter, comprising:

a filter housing defining an interior cavity;

an isolation shield disposed within said filter housing to divide the interior cavity into first and second filter cavities;

first and second filter sections disposed within said first and second filter cavities, respectively; and at least one ground post extending from said isolation shield and making electrical contact with at least one of said first and second filter sections at a position spaced axially from said isolation shield by a predetermined distance.

* * * * *